(12) United States Patent
Liao et al.

(10) Patent No.: US 10,897,131 B2
(45) Date of Patent: Jan. 19, 2021

(54) ELECTROSTATIC DISCHARGE PROTECTION CIRCUIT FOR BYPASSING AN ESD CURRENT

(71) Applicant: UNITED MICROELECTRONICS CORP., Hsin-Chu (TW)

(72) Inventors: Yu-Cheng Liao, Yunlin County (TW); Ting-Yao Lin, Taichung (TW); Ping-Chen Chang, Pingtung County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 498 days.

(21) Appl. No.: 15/878,421

(22) Filed: Jan. 24, 2018

(65) Prior Publication Data

US 2019/0229531 A1    Jul. 25, 2019

(51) Int. Cl.
| | | |
|---|---|---|
| *H02H 9/00* | (2006.01) | |
| *H02H 9/04* | (2006.01) | |
| *H02H 1/00* | (2006.01) | |
| *H01L 27/02* | (2006.01) | |
| *H01L 27/06* | (2006.01) | |

(52) U.S. Cl.
CPC ......... *H02H 9/046* (2013.01); *H01L 27/0266* (2013.01); *H01L 27/0285* (2013.01); *H01L 27/0288* (2013.01); *H02H 1/0007* (2013.01); *H01L 27/0629* (2013.01)

(58) Field of Classification Search
None
See application file for complete search history.

(56) References Cited

U.S. PATENT DOCUMENTS

| | | | |
|---|---|---|---|
| 7,466,527 B1 * | 12/2008 | Juang ............... | H01L 27/0266 361/111 |
| 8,000,068 B2 * | 8/2011 | Brown, Jr. ....... | H03K 17/08104 361/56 |
| 8,247,839 B2 | 8/2012 | Van Wijmeersch | |
| 9,054,520 B2 * | 6/2015 | Worley ............. | H02H 9/046 |
| 9,325,164 B2 | 4/2016 | Chen | |

* cited by examiner

*Primary Examiner* — Stephen W Jackson
(74) *Attorney, Agent, or Firm* — Winston Hsu

(57) ABSTRACT

An electrostatic discharge (ESD) protection circuit has a first power node, a second power node, an ESD detect circuit, an ESD device and a voltage controlled switch. The ESD detect circuit is coupled between the first power node and the second power node for detecting an ESD current to output a control signal at a output terminal of the ESD detect circuit. The ESD device is coupled between the first power node and the second power node for leaking the ESD current. The voltage controlled switch is used to couple a body of the ESD device to the second power node according to at least a voltage level of the control signal.

17 Claims, 2 Drawing Sheets

US 10,897,131 B2

ELECTROSTATIC DISCHARGE PROTECTION CIRCUIT FOR BYPASSING AN ESD CURRENT

BACKGROUND OF THE INVENTION

1. Field of the Invention

The present invention is related to an electrostatic discharge (ESD) protection circuit. More particularly, the present invention relates to an ESD protection circuit for bypassing an ESD current with high performance and low power consumption.

2. Description of the Prior Art

As semiconductor technology advances, the integration of semiconductor devices is enhanced by, for example, reducing the line width and increasing stacked layers of the semiconductor device. For example, as the scale of the metal on oxide semiconductor (MOS) device is reduced, the gate oxide has to be thinner, the channel length has to be shorter, the source/drain junction has to be shallower, and the lightly doped drain (LDD) structure has to be adopted. However, as the area and the tolerance of the integrated circuits (IC) reduce, the damage caused by the electrostatic discharge (ESD) could become a serious problem.

Conventionally, the waveform of the electrostatic discharge (ESD) has the properties of short rising time (e.g., generally between 5 ns to 15 ns) and high pulse voltage (e.g., generally between 1000V to 3000V). Therefore, when the integrated circuit (IC) is damaged by the ESD, the IC may get punched through or burned out suddenly.

In general, in order to resolve the problems described above, an ESD protection circuit is generally disposed between the input and output pads of the IC to protect the IC from the ESD damage by shunting the electrostatic charges of the ESD source from the IC.

SUMMARY OF THE INVENTION

One embodiment of the present invention discloses an electrostatic discharge (ESD) protection circuit. The ESD protection circuit comprises a first power node, a second power node, an ESD detect circuit, an ESD device and a voltage controlled switch. The ESD detect circuit is coupled between the first power node and the second power node for detecting an ESD current to output a control signal at a output terminal of the ESD detect circuit. The ESD device is coupled between the first power node and the second power node for leaking the ESD current. The voltage controlled switch is configured to couple a body of the ESD device to the second power node according to at least a voltage level of the control signal.

Another embodiment of the present invention discloses an electrostatic discharge (ESD) protection circuit. The ESD protection circuit comprises a first power node, a second power node, an ESD detect circuit, an ESD clamp circuit and a voltage controlled switch. A first terminal of the ESD detect circuit is coupled to the first power node, and a second terminal of the ESD detect circuit is coupled to the second power node. A first end of the ESD clamp circuit is coupled to the first power node, a second end of the ESD clamp circuit is coupled to the second power node, and a control end of the ESD clamp circuit is coupled to a second output terminal of the ESD detect circuit. A first end of the voltage controlled switch is coupled to a body of the ESD clamp circuit, a second end of the voltage controlled switch is coupled to the second power node, and a first control end of the voltage controlled switch is coupled to a first output terminal of the ESD detect circuit.

These and other objectives of the present invention will no doubt become obvious to those of ordinary skill in the art after reading the following detailed description of the preferred embodiment that is illustrated in the various figures and drawings.

DETAILED DESCRIPTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
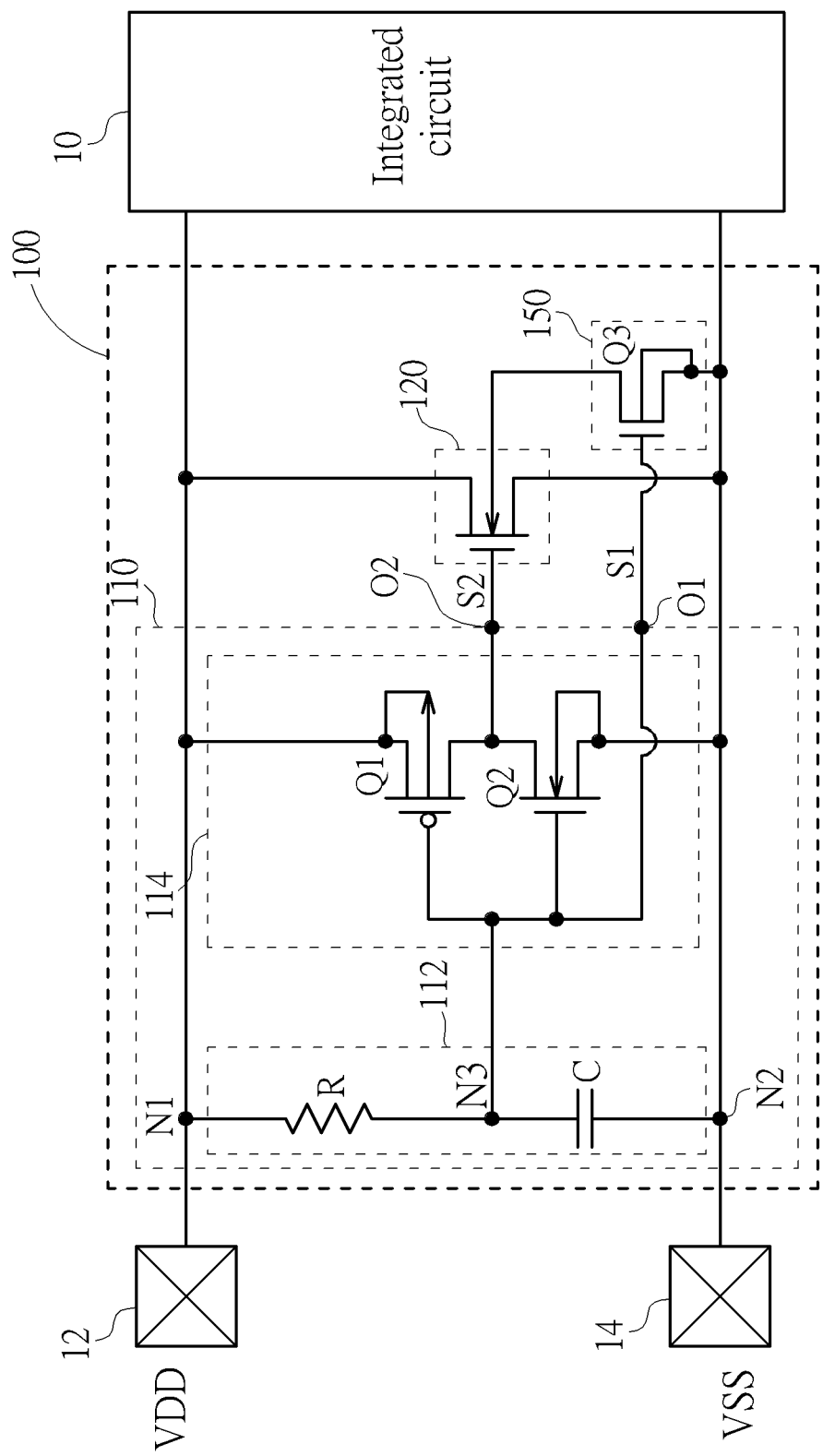
FIG. 1 is a circuit diagram of an ESD protection circuit coupled to two contact pads for protecting an integrated circuit from ESD damage according to one embodiment of the present invention.

Please refer to FIG. 1. FIG. 1 is a circuit diagram of an electrostatic discharge (ESD) protection circuit 100 coupled between a first contact pad 12 and a second contact pad 14 for protecting an integrated circuit (IC) 10 from ESD damage according to one embodiment of the present invention. The ESD protection circuit 100 comprises a first power node N1, a second power node N2, an ESD detect circuit 110, an ESD device 120 and a voltage controlled switch 150. The first power node N1 is coupled to the first contact pad 12, and the second power node N2 is coupled to the second contact pad 14. The ESD detect circuit 110 is coupled between the first power node N1 and the second power node N2 and is configured to detect an ESD current so as to output a first control signal S1 at a first output terminal O1 of the ESD detect circuit 110.

The ESD detect circuit 110 comprises a resistor-capacitor (RC) circuit 112 and an inverter 114. The RC circuit 112 is coupled between the first power node N1 and second power node N2 and functions as a low pass filter (LPF). The RC circuit 112 comprises a resistor R and a capacitor C. A first end of the resistor R is coupled to the first power node N1, a second end of the resistor R and a first end of the capacitor C are coupled to the first output terminal O1 of the ESD detect circuit 110, and a second end of the capacitor C is coupled to the second power node N2. The inverter 114 outputs a second control signal S2 at a second output terminal O2 of the ESD detect circuit 110. In other words, the ESD detect circuit 110 further outputs the second control signal S2 at the second output terminal O2 of the ESD detect circuit 110 by detecting the ESD current. Basically, since the first control signal S1 is inputted to the inverter 114, the voltage level of the second control signal S2 is complementary to the voltage level of the first control signal S1. The inverter 114 comprises a first transistor Q1 and a second transistor Q2. In an embodiment of the present invention, the first transistor Q1 may be a P-type metal-oxide-semiconductor field-effect transistor (PMOSFET), and the second transistor Q2 may be an N-type MOSFET (NMOSFET). A control end (i.e., gate) of the first transistor Q1 is coupled to the first output terminal O1 of the ESD detect circuit 110, a first end (i.e., source) of the first transistor Q1 is coupled to the first power node N1, and a second end (i.e., drain) of the first transistor Q1 is coupled to a control end (i.e., gate) of the ESD device 120. A control end (i.e., gate) of the second transistor Q2 is coupled to the first output terminal O1 of the ESD detect circuit 110, a first end (i.e., drain) of the second transistor Q2 is coupled to the control end of the ESD device 120, and a second end (i.e., source) of the second transistor Q2 is coupled to the second power node N2.

The ESD device 120 is coupled between the first power node N1 and the second power node N2 and is configured to leak an ESD current when the ESD detect circuit 110 detects any ESD current. The ESD device 120 may comprise an NMOSFET and function as an ESD clamp circuit. The ESD device 120 and the ESD detect circuit 110 are coupled to each other in a gate-driven manner. The voltage controlled switch 150 controls the electrical connection between the body of the ESD device 120 and the second power node N2 according to a voltage level of the first control signal S1. A first end of the voltage controlled switch 150 is coupled to the body of the ESD device 120, a second end of the voltage controlled switch 150 is coupled to the second power node N2, and a first control end of the voltage controlled switch 150 is coupled to the first output terminal O1 of the ESD detect circuit 110. In the embodiment, the voltage controlled switch 150 may comprise a third transistor Q3. A first end (i.e., drain) of the third transistor Q3 is coupled to the body of the ESD device 120, a second end (i.e., source) of the third transistor Q3 is coupled to the second power node N2, and a control end (i.e., gate) of the third transistor Q3 is coupled to the first output terminal O1.

In a normal operating status of the IC 10, the first power node N1 is coupled to a first contact pad 12 for receiving a first supply voltage (e.g., a drain voltage VDD) from the first contact pad 12, and the second power node N2 is coupled to a second contact pad 14 for receiving a second supply voltage (e.g., a source voltage VSS) from the second contact pad 14. Since the first supply voltage VDD is applied to the first power node N1 through the first contact pad 12, a voltage of a third node N3 has a magnitude VDD, so that the first transistor Q1 of the inverter 114 is turned off and the second transistor Q2 and the third transistor Q3 are turned on. Therefore, a voltage of the second output terminal O2 of the ESD detect circuit 110 has a magnitude VSS, and the body of the ESD device 120 is coupled to the second power node N2 via the third transistor Q3. Under this circumstance, the NMOSFET of the ESD device 120 is not turned on. Moreover, since the body of the ESD device 120 is coupled to the second power node N2 and biased by the source voltage VSS, a leakage current flowing through the ESD device 120 would be very small. Accordingly, the ESD protection circuit 100 would have low power consumption when the IC 10 operates in the normal operating status.

In a case that the electrostatic discharge is generated at the first contact pad 12, the voltage at the first power node N1 is abruptly increased. Due to the frequency response of the RC circuit 112, the third node N3 and the first output terminal O1 are temporarily maintained at the low voltage level. Correspondingly, the control ends (i.e., gates) of the first transistor Q1, the second transistor Q2 and the third transistor Q3 are maintained at the low voltage level. Under this circumstance, the first transistor Q1 is turned on, but the second transistor Q2 and the third transistor Q3 are turned off. After the first transistor Q1 is turned on, a second control signal S2 at the second output terminal O2 is changed to have the same high voltage level as the voltage at the first power node N1. Due to the change of the voltage level of the second control signal S2 at the second output terminal O2, the NMOSFET of the ESD device 120 is turned on. Under this circumstance, the electrostatic discharge generated at the first contact pad 12 is conducted to the second contact pad 14 (i.e., a ground terminal) through the ESD device 120. Moreover, since the third transistor Q3 is turned off, the electrical connection between the body of the ESD device 120 and the second power node N2 is not established. Accordingly, the body of the ESD device 120 is floating, such that the ESD current would flow quickly from the first contact pad 12 through the ESD device 120 to the second contact pad 14. Therefore, the ESD protection circuit 100 has high performance for bypassing the ESD current.

Figure 2:
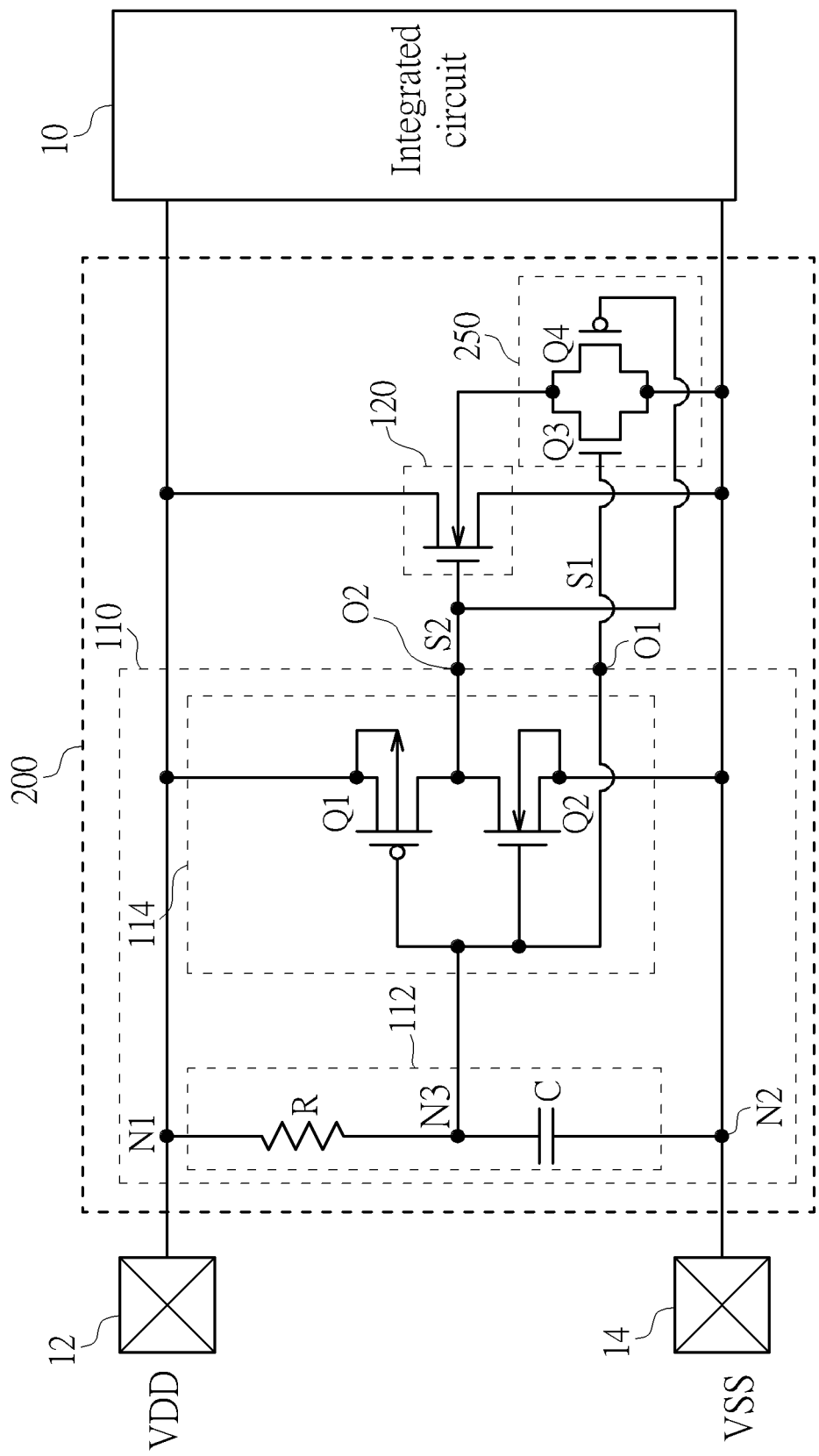
FIG. 2 is a circuit diagram of an ESD protection circuit coupled to two contact pads for protecting an integrated circuit from ESD damage according to another embodiment of the present invention.

Please refer to FIG. 2. FIG. 2 is a circuit diagram of an ESD protection circuit 200 coupled between the first contact pad 12 and the second contact pad 14 for protecting the IC 10 from ESD damage according to another embodiment of the present invention. The major difference between the two ESD protection circuits 100 and 200 is that the voltage controlled switch 150 of the ESD protection circuit 100 is replaced by a voltage controlled switch 250 of the ESD protection circuit 200. A first end of the voltage controlled switch 250 is coupled to the body of the ESD device 120, a second end of the voltage controlled switch 250 is coupled to the second power node N2, a first control end of the voltage controlled switch 250 is coupled to the first output terminal O1 of the ESD detect circuit 110, and a second control end of the voltage controlled switch 250 is coupled to the second output terminal O2 of the ESD detect circuit 110. In the embodiment, the voltage controlled switch 250 is a transmission gate having a third transistor Q3 and a fourth transistor Q4. The third transistor Q3 may be an NMOSFET, and the fourth transistor Q4 may be a PMOSFET. A first end (i.e., drain) of the third transistor Q3 is coupled to the body of the ESD device 120, a second end (i.e., source) of the third transistor Q3 is coupled to the second power node N2, and a control end (i.e., gate) of the third transistor Q3 is coupled to the first output terminal O1. A first end (i.e., source) of the fourth transistor Q4 is coupled to the body of the ESD device 120, a second end (i.e., drain) of the fourth transistor Q4 is coupled to the second power node N2, and a control end (i.e., gate) of the fourth transistor Q4 is coupled to the second output terminal O2. In the embodiment, the voltage controlled switch 250 couples the body of the ESD device 120 to the second power node N2 according to the voltage level of the first control signal S1 and the voltage level of the second control signal S2, as shown in FIG. 2.

In a normal operating status of the IC 10, the first power node N1 is coupled to a first contact pad 12 for receiving a first supply voltage (e.g., a drain voltage VDD) from the first contact pad 12, and the second power node N2 is coupled to a second contact pad 14 for receiving a second supply voltage (e.g., a source voltage VSS) from the second contact pad 14. Since the first supply voltage VDD is applied to the first power node N1 through the first contact pad 12, a voltage of a third node N3 has a magnitude VDD, so that the first transistor Q1 of the inverter 114 is turned off and the second transistor Q2 and the third transistor Q3 are turned on. Therefore, a voltage at the second output terminal O2 of the ESD detect circuit 110 has a magnitude VSS, and the fourth transistor Q4 is turned on. Accordingly, the body of the ESD device 120 is coupled to the second power node N2 via the third transistor Q3 and the fourth transistor Q4. Under this circumstance, the NMOSFET of the ESD device 120 is turned off. Moreover, since the body of the ESD device 120 is coupled to the second power node N2 and biased by the source voltage VSS, a leakage current flowing through the ESD device 120 would be very small. Accordingly, the ESD protection circuit 200 would have low power consumption when the IC 10 operates in the normal operating status.

In a case that the electrostatic discharge is generated at the first contact pad 12, the voltage at the first power node N1 is abruptly increased. Due to the frequency response of the RC circuit 112, the third node N3 and the first output terminal O1 are temporarily maintained at the low voltage level. Correspondingly, the control ends (i.e., gates) of the first transistor Q1, the second transistor Q2 and the third transistor Q3 are maintained at the low voltage level. Under this circumstance, the first transistor Q1 is turned on, but the second transistor Q2 and the third transistor Q3 are turned off. After the first transistor Q1 is turned on, a second control signal S2 at the second output terminal O2 is changed to have the same high voltage level as the voltage at the first power node N1. Due to the change of the voltage level of the second control signal S2 at the second output terminal O2, the NMOSFET of the ESD device 120 is turned on and the fourth transistor Q4 of the voltage controlled switch 250 is turned off. Under this circumstance, the electrostatic discharge generated at the first contact pad 12 is conducted to the second contact pad 14 (i.e., a ground terminal) through the ESD device 120. Moreover, since the third transistor Q3 and the fourth transistor Q4 are turned off, the electrical connection between the body of the ESD device 120 and the second power node N2 is not established. Accordingly, the body of the ESD device 120 is floating, such that the ESD current would flow quickly from the first contact pad 12 through the ESD device 120 to the second contact pad 14. Therefore, the ESD protection circuit 200 has high performance for bypassing the ESD current.

From the above description, by controlling the voltage controlled switch, the body of the ESD device 120 of the ESD protection circuit is electrically connected to or disconnected from the second power node N2. Accordingly, the ESD protection circuit 200 would have low power consumption when the IC 10 operates in the normal operating status and have high performance for bypassing the ESD current when the ESD event occurs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection circuit, comprising:
   a first power node;
   a second power node;
   an ESD detect circuit, coupled between the first power node and the second power node, and configured to detect an ESD current to output a first control signal at a first output terminal of the ESD detect circuit and output a second control signal at a second output terminal of the ESD detect circuit;
   an ESD device, coupled between the first power node and the second power node, and configured to couple the first power node to the second power node to leak the ESD current according to a voltage level of the second control signal; and
   a voltage controlled switch, configured to couple a body of the ESD device to the second power node according to at least a voltage level of the first control signal.

2. The ESD protection circuit of claim 1, wherein the voltage controlled switch couples the body of the ESD device to the second power node according to the voltage level of the first control signal and the voltage level of the second control signal.

3. The ESD protection circuit of claim 1, wherein the voltage level of the first control signal is complementary to the voltage level of the second control signal.

4. The ESD protection circuit of claim 1, wherein the ESD detect circuit comprises:
   a resistor-capacitor (RC) circuit, coupled to the first power node and the second power node, and comprising a resistor and a capacitor, a second end of the resistor and a first end of the capacitor being coupled to the first output terminal; and
   an inverter, an input terminal of the inverter being coupled to the first output terminal, and an output terminal of the inverter being coupled to a control end of the ESD device.

5. The ESD protection circuit of claim 4, wherein a first end of the resistor is coupled to the first power node, and a second end of the capacitor is coupled to the second power node.

6. The ESD protection circuit of claim 4, wherein the ESD device couples the first power node to the second power node to leak the ESD current according to a voltage level of the output terminal of the inverter.

7. The ESD protection circuit of claim 4, wherein the inverter comprises:
   a first transistor, a control end of the first transistor being coupled to the first output terminal, a first end of the first transistor being coupled to the first power node, and a second end of the first transistor being coupled to the control end of the ESD device; and
   a second transistor, a control end of the second transistor being coupled to the first output terminal, a first end of the second transistor being coupled to the control end of the ESD device, and a second end of the second transistor being coupled to the second power node.

8. The ESD protection circuit of claim 1, wherein the voltage controlled switch comprises a third transistor, a first end of the third transistor is coupled to the body of the ESD device, a second end of the third transistor is coupled to the second power node, and a control end of the third transistor is coupled to the first output terminal.

9. The ESD protection circuit of claim 1, wherein the voltage controlled switch comprises:
   a third transistor, a first end of the third transistor being coupled to the body of the ESD device, a second end of the third transistor being coupled to the second power node, and a control end of the third transistor being coupled to the first output terminal; and
   a fourth transistor, a first end of the fourth transistor being coupled to the body of the ESD device, a second end of the fourth transistor being coupled to the second power node, and a control end of the fourth transistor being coupled to the second output terminal.

10. An electrostatic discharge (ESD) protection circuit, comprising:
    a first power node;
    a second power node;
    an ESD detect circuit, comprising:
       a resistor-capacitor (RC) circuit, coupled to the first power node and the second power node, and comprising a resistor and a capacitor, a second end of the resistor and a first end of the capacitor being coupled to a first output terminal of the ESD detect circuit; and an inverter, an input terminal of the inverter being coupled to the first output terminal, and an output terminal of the inverter being coupled to a second output terminal of the ESD detect circuit;

an ESD clamp circuit, a first end of the ESD clamp circuit being coupled to the first power node, a second end of the ESD clamp circuit being coupled to the second power node, and a control end of the ESD clamp circuit being coupled to the second output terminal of the ESD detect circuit; and a voltage controlled switch, a first end of the voltage controlled switch being coupled to a body of the ESD clamp circuit, a second end of the voltage controlled switch being coupled to the second power node, and a first control end of the voltage controlled switch being coupled to the first output terminal.

11. An electrostatic discharge (ESD) protection circuit, comprising:

a first power node;

a second power node;

an ESD detect circuit, a first terminal of the ESD detect circuit being coupled to the first power node, and a second terminal of the ESD detect circuit being coupled to the second power node;

an ESD clamp circuit, a first end of the ESD clamp circuit being coupled to the first power node, a second end of the ESD clamp circuit being coupled to the second power node, a control end of the ESD clamp circuit being coupled to a second output terminal of the ESD detect circuit, and the ESD detect circuit being configured to detect an ESD current to output a first control signal at the first output terminal of the ESD detect circuit; and a voltage controlled switch, a first end of the voltage controlled switch being coupled to a body of the ESD clamp circuit, a second end of the voltage controlled switch being coupled to the second power node, a first control end of the voltage controlled switch being coupled to a first output terminal of the ESD detect circuit, and the voltage controlled switch being configured to couple the body of the ESD clamp circuit to the second power node according to at least a voltage level of the first control signal;

wherein the ESD detect circuit further outputs a second control signal at the second output terminal of the ESD detect circuit by detecting the ESD current, and the ESD clamp circuit couples the first power node to the second power node to leak the ESD current according to a voltage level of the second control signal.

12. The ESD protection circuit of claim 11, wherein a second control end of the voltage controlled switch is coupled to the second output terminal of the ESD detect circuit, and the voltage controlled switch couples the body of the ESD clamp circuit to the second power node according to the voltage level of the first control signal and the voltage level of the second control signal.

13. The ESD protection circuit of claim 10, wherein a first end of the resistor is coupled to the first power node, and a second end of the capacitor is coupled to the second power node.

14. The ESD protection circuit of claim 10, wherein the ESD clamp circuit couples the first power node to the second power node to leak the ESD current according to a voltage level of the output terminal of the inverter.

15. The ESD protection circuit of claim 10, wherein the inverter comprises:

a first transistor, a control end of the first transistor being coupled to the first output terminal, a first end of the first transistor being coupled to the first power node, and a second end of the first transistor being coupled to the control end of the ESD clamp circuit; and a second transistor, a control end of the second transistor being coupled to the first output terminal, a first end of the second transistor being coupled to the control end of the ESD clamp circuit, and a second end of the second transistor being coupled to the second power node.

16. The ESD protection circuit of claim 10, wherein the voltage controlled switch comprises a third transistor, a first end of the third transistor is coupled to the body of the ESD clamp circuit, a second end of the third transistor is coupled to the second power node, and a control end of the third transistor is coupled to the first output terminal.

17. The ESD protection circuit of claim 10, wherein the voltage controlled switch comprises:

a third transistor, a first end of the third transistor being coupled to the body of the ESD clamp circuit, a second end of the third transistor being coupled to the second power node, and a control end of the third transistor being coupled to the first output terminal; and a fourth transistor, a first end of the fourth transistor being coupled to the body of the ESD clamp circuit, a second end of the fourth transistor being coupled to the second power node, and a control end of the fourth transistor being coupled to the second output terminal.

* * * * *